US010816066B2

(12) United States Patent
Cai et al.

(10) Patent No.: US 10,816,066 B2
(45) Date of Patent: Oct. 27, 2020

(54) MANUAL-AUTOMATIC INTEGRATED UNLOADING DEVICE AND DISPLAY SCREEN MODULE STRUCTURE

(71) Applicant: ROE Visual Co., Ltd., Shenzhen, Guangdong (CN)

(72) Inventors: Danhu Cai, Guangdong (CN); Shunwen Tian, Guangdong (CN); Chen Lu, Guangdong (CN); Dries Vermeulen, Guangdong (CN)

(73) Assignee: ROE Visual Co., Ltd., Shenzhen (CN)

( * ) Notice: Subject to any disclaimer, the term of this patent is extended or adjusted under 35 U.S.C. 154(b) by 261 days.

(21) Appl. No.: 16/066,299

(22) PCT Filed: Jun. 1, 2018

(86) PCT No.: PCT/CN2018/089613
§ 371 (c)(1),
(2) Date: Jun. 27, 2018

(87) PCT Pub. No.: WO2019/227481
PCT Pub. Date: Dec. 5, 2019

(65) Prior Publication Data
US 2019/0368581 A1    Dec. 5, 2019

(51) Int. Cl.
*F16H 25/14*        (2006.01)
*F16D 1/10*         (2006.01)
(Continued)

(52) U.S. Cl.
CPC .............. *F16H 25/14* (2013.01); *F16D 1/10* (2013.01); *H05K 5/0017* (2013.01);
(Continued)

(58) Field of Classification Search
CPC ... G02F 1/133308; G02F 2001/133314; G02F 2001/133322; H05K 5/0017; H05K 5/0217
See application file for complete search history.

(56) References Cited

U.S. PATENT DOCUMENTS 7,006,169 B2 *   2/2006   Liu ................... G02F 1/133308
                                                         349/58
9,234,652 B2 *   1/2016   Wu ....................... F21V 19/001
(Continued)

FOREIGN PATENT DOCUMENTS

CN              107038957 A       8/2017

*Primary Examiner* — Tyrone V Hall, Jr.

(57) ABSTRACT

The present invention discloses a manual-automatic integrated unloading device, comprising an electric driving member, a transmission member, an abutment member and a push-out rod. The push-out rod is movably arranged along a length direction thereof, the electric driving member and the push-out rod are respectively connected to the transmission member, and the electric driving member drives the push-out rod to butt against the abutment member through the transmission member to increase spacing between the abutment member and the electric driving member. The present invention further comprises a rotating handle connected to the transmission member, the rotating handle drives the push-out rod to butt against the abutment member through the transmission member to increase the spacing between the abutment member and the electric driving member. For a display screen module with a short mounting position, a user separates a mounting frame body from a display screen by operating the rotation handle.

13 Claims, 5 Drawing Sheets

(51) Int. Cl.
 *H05K 5/02* (2006.01)
 *H05K 5/00* (2006.01)
 *F16H 1/16* (2006.01)
(52) U.S. Cl.
 CPC ..... *H05K 5/0217* (2013.01); *F16D 2001/102* (2013.01); *F16H 1/16* (2013.01)

(56) References Cited

U.S. PATENT DOCUMENTS

2008/0024695 A1* 1/2008 Yan .................. G02F 1/133308
 349/58
2015/0195932 A1* 7/2015 Lee .................... H05K 5/0217
 361/749

* cited by examiner

MANUAL-AUTOMATIC INTEGRATED UNLOADING DEVICE AND DISPLAY SCREEN MODULE STRUCTURE

TECHNICAL FIELD

The present invention relates to the field of display screen technologies, and more particularly, to a manual-automatic integrated unloading device and a display screen module structure.

BACKGROUND

Chinese Patent Application No. 201710233922.0 discloses a display screen that can be automatically ejected from a mounting frame. An unloading device is provided on the display screen. The mounting frame is butted against by the unloading device so that relative movement occurs between the unloading device and the mounting frame, thus separating the display screen from the mounting frame. To be specific, the unloading device comprises an electric driving member, a transmission member, an abutment member and a push-out rod, wherein the push-out rod is movably arranged along a length direction thereof, the push-out rod and the abutment member are matched, the electric driving member and the push-out rod are respectively connected to the transmission member, and the electric driving member drives the push-out rod to slid on the abutment member through the transmission member to increase spacing between the abutment member and the electric driving member (the abutment member and/or the push-out rod is provided with an inclined plane, and the inclined plane is a mating surface); the electric driving member is arranged in the display screen, and the abutment member is arranged in the mounting frame, vice versa.

At some point, maintenance personnel can manually separate the display screen from the mounting frame manually (for example, when the display screen is less than 2 meters from the ground), which can reduce the power consumption. However, the above-mentioned unloading device does not allow a user to perform a manual operation; therefore, the existing unloading device needs to be improved.

SUMMARY

The technical problem to be solved by the present invention is: to provide a manual-automatic integrated unloading device and a display screen module having the manual-automatic integrated unloading device.

In order to solve the above technical problem, the technical solution adopted by the present invention is as follows: a manual-automatic integrated unloading device comprises an electric driving member, a transmission member, an abutment member and a push-out rod. The push-out rod is movably arranged along a length direction thereof, the electric driving member and the push-out rod are respectively connected to the transmission member, and the electric driving member drives the push-out rod to butt against the abutment member through the transmission member to increase spacing between the abutment member and the electric driving member. The manual-automatic integrated unloading device further comprises a rotating handle connected to the transmission member, and the rotating handle drives the push-out rod to butt against the abutment member through the transmission member to increase the spacing between the abutment member and the electric driving member.

In order to solve the above technical problem, the technical solution further adopted by the present invention is as follows: a display screen module structure comprises a mounting frame and a display screen mounted cooperatively, wherein the display screen comprises a bottom shell, a screen body arranged on a front surface of the bottom shell and a power box arranged on a back surface of the bottom case, and the display screen module structure further comprises the above-mentioned manual-automatic integrated unloading device.

The present invention has the beneficial effects that: for a display module with a short mounting position, the user can increase the spacing between the abutment member and the electric driving member by operating the rotating handle, so as to separate a mounting frame body from a display screen without using the electric driving member, thus reducing the power consumption, and being more environmentally friendly.

REFERENCE NUMERALS 1 refers to mounting frame; 2 refers to power box; 3 refers to electric driving member; 4 refers to transmission member; 41 refers to elastic member; 42 refers to cam; 421 refers to limiting hole; 422 refers to buckling position; 423 refers to arc surface; 5 refers to abutment member; 6 refers to push-out rod; 61 refers to wedge-shaped block, 62 refers to bulge; 7 refers to rotating handle; 81 refers to sliding slot; 82 refers to guiding member; 9 refers to rotating shaft; 91 refers to turbine; 92 refers to clamping segment; 10 refers to roller wheel; 11 refers to turnplate; and 12 refers to movable member.

DETAILED DESCRIPTION

To describe the technical contents, the achieved objects, and the effects of the present invention in detail, the following description will be given with reference to the embodiments and the accompanying drawings.

The most crucial idea of the present invention is: adding the rotating handle connected to the transmission member, thus capable of separating the display screen from the mounting frame by the rotating handle.

Referring to FIG. 1 to FIG. 13, a manual-automatic integrated unloading device comprises an electric driving member 3, a transmission member 4, an abutment member 5 and a push-out rod 6. The push-out rod 6 is movably arranged along a length direction thereof, the electric driving member 3 and the push-out rod 6 are respectively connected to the transmission member 4, and the electric driving member 3 drives the push-out rod 6 to butt against the abutment member 5 through the transmission member 4 to increase spacing between the abutment member 5 and the electric driving member 3. The manual-automatic integrated unloading device further comprises a rotating handle 7 connected to the transmission member 4, the rotating handle 7 drives the push-out rod 6 to butt against the abutment member 5 through the transmission member 4 to increase the spacing between the abutment member 5 and the electric driving member 3.

As can be seen from the above description, the beneficial effects of the present invention are as follows: for a display module with a short mounting position, the user can increase the spacing between the abutment member and the electric driving member by operating the rotating handle, so as to separate a mounting frame body from a display screen without using the electric driving member, thus reducing the power consumption, and being more environmentally friendly.

Further, the transmission member 4 comprises a turnplate 11 and a movable member 12, the movable member 12 is arranged far away from the abutment member 5, one end of the movable member 12 is rotatably connected to the push-out rod 6, and the other end of the movable member 12 is rotatably connected to the turnplate 11; a connected portion between the movable member 12 and the turnplate 11 is eccentrically arranged with a rotation center axis of the turnplate 11; and the electric driving member 3 and the rotating handle 7 are respectively connected to the turnplate 11.

Further, the transmission member 4 comprises a rotatably arranged cam 42, one end of the push-out rod 6 far away from the abutment member 5 abuts against an outer edge of the cam 42, and the electric driving member 3 and the rotating handle 7 are respectively connected to the cam 42.

From the above description, it can be seen that the transmission member has a simple structure and is easy to process.

Further, an elastic member 41 is further comprised. The elastic member 41 is connected to the push-out rod 6 and used to drive the push-out rod 6 to move towards the cam 42.

From the above description, it can be seen that the arrangement of the elastic member can ensure that one end of the push-out rod far away from the abutment member always butts against the cam, that is, the push-out rod can be automatically retracted.

Further, the transmission member 4 comprises a rotatably arranged turntable 11 and a rotatably arranged cam 42, and an end of the push-out lever 6 far from the abutment member 5 butts against on an outer edge of the cam 42.

A movable member 12 is further comprised, the movable member 12 is arranged far away from the abutment member 5, one end of the movable member 12 is rotatably connected to the push-out rod 6, and the other end of the movable member 12 is rotatably connected to the turntable 11; a connected portion between the movable member 12 and the turntable 11 is eccentrically arranged with a rotation center axis of the turntable 11.

The turntable 11 is connected to the electric driving member 3, the cam 42 is fixedly connected to the rotating handle 7, or the cam 42 is connected to the electric driving member 3, and the turntable 11 is fixedly connected to the rotating handle 7.

Further, an elastic member 41 is further comprised. The elastic member 41 is connected to the push-out rod 6 and used to drive the push-out rod 6 to move towards the cam 42.

Further, an output end of the electric driving member 3 is connected to a rotating shaft 9, the rotating handle 7 is arranged in the rotating shaft 9 and is rotatably arranged relative to the rotating shaft 9, the turntable 11 connected to the electric driving member 3 is fixed in the rotating shaft 9, or the cam 42 connected to the electric driving member 3 is fixed in the rotating shaft 9.

From the above description, it can be seen that when the turntable (or cam) fails to move the push-out rod away from the transmission member due to a failure, a user can make the manual-automatic integrated unloading device to work by controlling the electric driving member or the rotating handle connected to the cam (or turntable), which is beneficial for enhancing the user experience.

Further, the transmission member 4 comprises two rotatably arranged cams 42, and rotation center axes of the two cams 42 are coincidentally arranged; outer edges of the two cams 42 respectively butt against one end of the push-out rod 6 far away from the abutment member 5; and one of the cams 42 is connected to the electric driving member 3 and the other cam 42 is fixedly connected to the rotating handle 7.

Further, the transmission member 4 further comprises an elastic member 41. The elastic member 41 is connected to the push-out rod 6 and used to drive the push-out rod 6 to move towards the cam 42.

Further, an output end of the electric driving member 3 is connected to a rotating shaft 9, the rotating handle 7 is arranged in the rotating shaft 9 and is rotatably arranged relative to the rotating shaft 9, and the cam 42 connected to the electric driving member 3 is fixed in the rotating shaft 9.

Further, the cam 42 comprises a first semi-circular segment, a rectangular segment and a second semi-circular segment, two opposite ends of the rectangular segment are respectively connected to the first semi-circular segment and the second semi-circular segment, and end faces of the other two ends of the rectangular segment are both concave arc surfaces 423.

From the above description, it can be known that the concave arc surfaces can allow one end of the push-out rod near the transmission member to slide smoothly on an outer peripheral wall of the cam, so as to avoid dead blockage between the push-out rod and the cam.

A display screen module structure comprises a mounting frame 1 and a display screen mounted cooperatively, wherein the display screen comprises a bottom shell, a screen body arranged on a front surface of the bottom shell and a power box 2 arranged on a back surface of the bottom case, and the display screen module structure further comprises the above-mentioned manual-automatic integrated unloading device.

Further, the electric driving member 3 is arranged in the display screen, and the abutment member 5 is arranged in the mounting frame 1; or, the electric driving member 3 is arranged in the mounting frame 1, and the abutment member 5 is arranged in the display screen.

Further, the electric driving member 3, the transmission member 4, the push-out rod 6, and the rotating handle 7 are all arranged in the power box 2, and the abutment member 5 is arranged in the mounting frame 1.

It can be known from the above description that the electric driving member, the transmission member, the push-out rod, and the rotating handle are all arranged in the power box instead of directly in the bottom shell, so as to prevent the screen body from being deformed due to a reaction force of the push-out rod to make a display effect of the display screen become worse.

Further, the push-out rod 6 is provided with a sliding slot 81 along a moving direction thereof, a guiding member 82 matched with the sliding slot 81 is arranged in the power box 2, and the push-out rod 6 is supported on the power box 2 through the guiding member 82.

From the above description, it can be seen that the sliding groove is arranged in the push-out rod, the guiding member is arranged in the power box, and the shaking of the push-out rod during movement can be reduced by the cooperation of the guiding member and the sliding slot. In addition, the push-out rod is supported by the guiding member so as to generate a certain distance from the power box, in this way, a frictional force generated during the movement of the push-out rod can be reduced, making the movement more smooth without blockage, and more importantly, the guiding member can provide a supporting force for the push-out rod, so as to avoid separation of the push-out rod from the power box.

Further, two sliding slots 81 are provided, and one guiding member 82 is correspondingly arranged in each slot 81.

From the above description, it can be seen that the moving direction of the push-out rod can be more accurate, and the trajectory of the push-out rod after being stressed is not easily deflected.

First Embodiment

Figure 1:
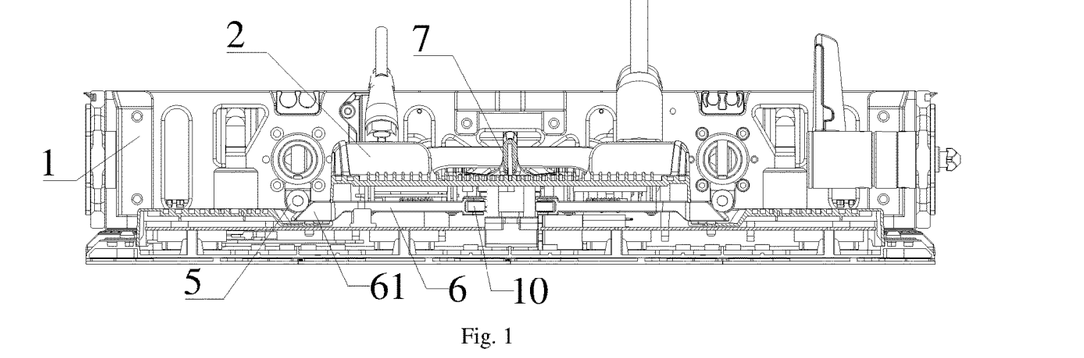
FIG. 1 is a section view of a display screen module according to a first embodiment of the present invention.
Figure 2:
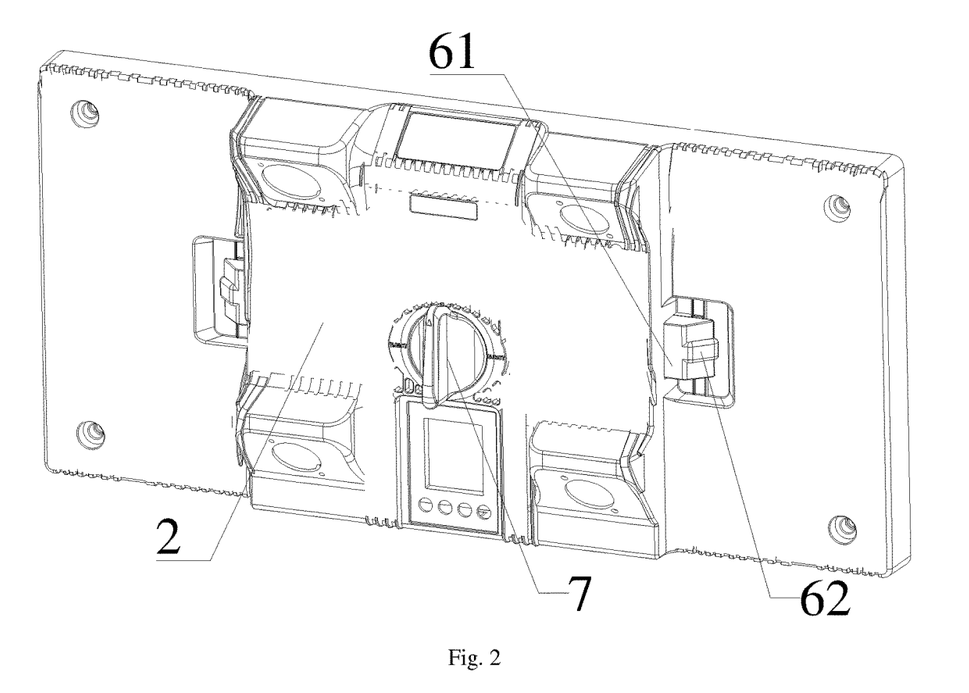
FIG. 2 is a structural schematic diagram of a display screen in a display screen module according to the first embodiment of the present invention (back surface)
Figure 3:
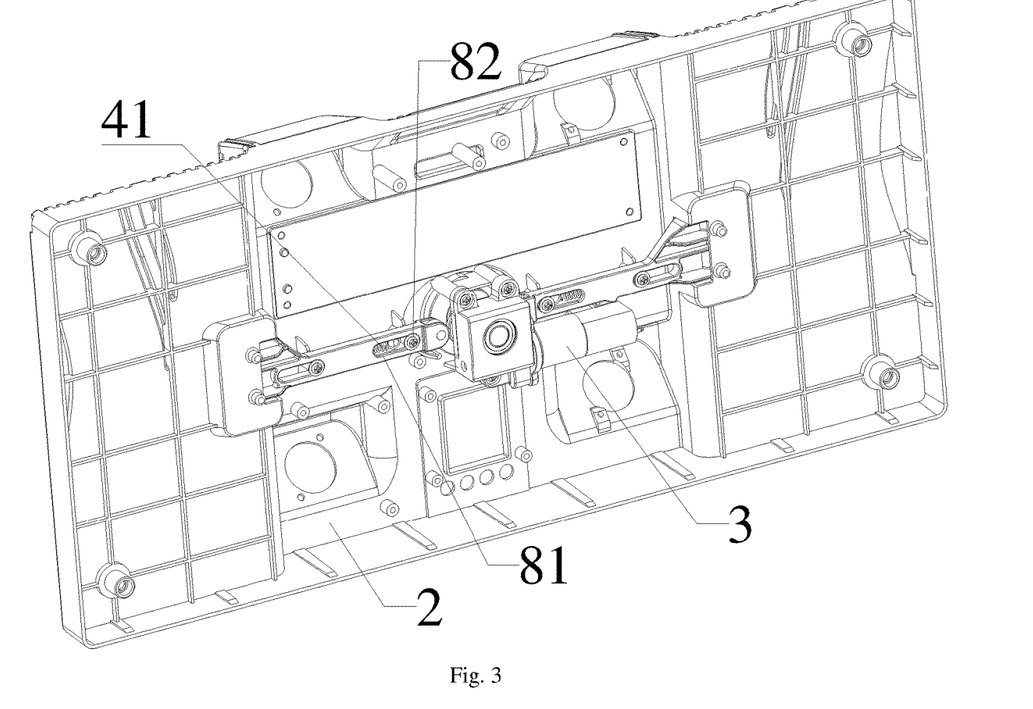
FIG. 3 is a structural schematic diagram of the display screen in the display screen module according to the first embodiment of the present invention (front surface)

Referring to FIG. 1 to FIG. 7, the first embodiment of the present invention is as follows: as shown in FIG. 1 to FIG. 3, a display module structure comprises a mounting frame 1, a display screen, and a manual-automatic integrated unloading device mounted cooperatively. The display screen comprises a bottom shell, a screen body on a front surface of the bottom shell and a power box 2 arranged on a back surface of the bottom case. Preferably, the power box 2 covers more than one fifth of area of the bottom shell.

Referring to FIG. 1 to FIG. 4, the manual-automatic integrated unloading device comprises an electric driving member 3, a transmission member 4, an abutment member 5 and a push-out rod 6. The push-out rod 6 is movably arranged along a length direction thereof, the electric driving member 3 and the push-out rod 6 are respectively connected to the transmission member 4, and the electric driving member 3 drives the push-out rod 6 to butt against the abutment member 5 through the transmission member 4 to increase spacing between the abutment member 5 and the electric driving member 3. The manual-automatic integrated unloading device further comprises a rotating handle 7 connected to the transmission member 4, the rotating handle 7 drives the push-out rod 6 to butt against the abutment member 5 through the transmission member 4 to increase the spacing between the abutment member 5 and the electric driving member 3. The electric driving member 3 is arranged in the display screen, and the abutment member 5 is arranged in the mounting frame 1; or, the electric driving member 3 is arranged in the mounting frame 1, and the abutment member 5 is arranged in the display screen.

The power box 2 is provided with open window for the rotating handle 7 to expose.

Figure 4:
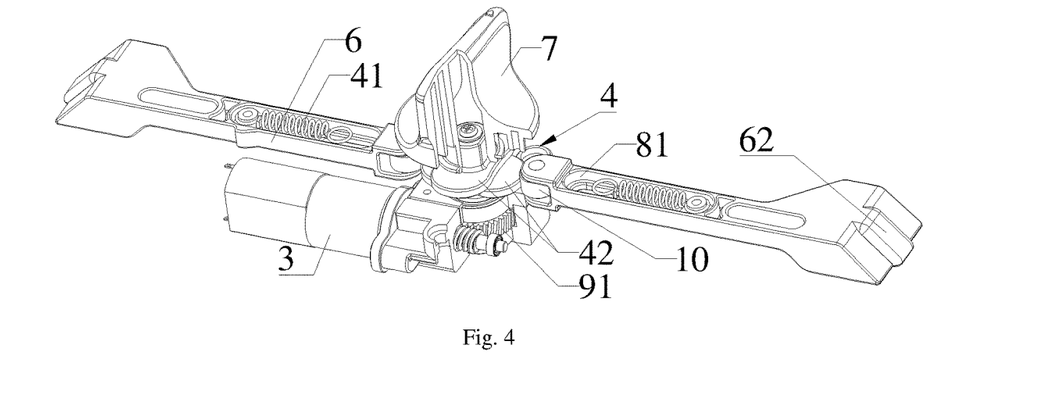
FIG. 4 is a structural schematic diagram of a manual-automatic integrated unloading device in the display screen module according to the first embodiment of the present invention (an abutment member is hidden)

Referring to FIG. 3 and FIG. 4, in order to ensure that the trajectory of the push-out rod 6 is linear, the push-out rod 6 is provided with a guiding member 82, and the display screen (the bottom shell or the power box 2) is provided with a guiding slot matched with the guiding member 82. Or, the push-out rod 6 is provided with the sliding slot, the display screen (the bottom shell or the power box 2) is provided with the guiding member 82 matched with the guiding slot, and the push-out rod 6 is supported on the power box 2 through the guiding member 82. In the embodiment, the push rod 6 is provided with the sliding groove 81 serving as a guiding slot, and the power box 2 is provided with a screw serving as the guiding member 82. One end of the screw penetrates through the sliding slot 81. Therefore, the screw also plays a role of mounting the push-out rod 6 to the power box 2 to prevent the push-out rod 6 from being separated from the power box 2. Further, two sliding slots 81 are provided, and one guiding member 82 is correspondingly arranged in each slot 81.

In the embodiment, the electric driving member 3, the transmission member 4, the push-out rod 6, and the rotating handle 7 are all arranged in the power box 2, and the abutment member 5 is arranged in the mounting frame 1. Further, one end of the push-out rod 6 far from the transmission member 4 is provided with a wedge block 61, and the abutment member 5 is a roller matched with an inclined plane of the wedge block 61. Preferably, as shown in FIG. 2 and FIG. 4, an outer peripheral wall of the roller has a bulge 62 (or a groove) arranged around a rotation center axis thereof, and the inclined plane of the wedge block 61 is provided with a groove (or bulge 62) matched with the bulge (or groove), so that the wedge block 61 can be restrained, so as to avoid any sliding of the wedge block 61 on a surface of the roller.

As shown in FIG. 4, as a specific embodiment, the transmission member comprises an elastic member 41 and two rotatably arranged cams 42, and rotation center axes of the two cams 42 are coincidentally arranged; outer edges of the two cams 42 respectively butt against one end of the push-out rod 6 far away from the abutment member 5; the elastic member 41 is connected to the push-out rod 6 and used to drive the push-out rod 6 to move towards the cam 42; and one of the cams 42 is connected to the electric driving member 3 and the other cam 42 is fixedly connected to the rotating handle 7. One end of the elastic member 41 is fixed in the bottom shell or the power box 2. Preferably, the elastic member 41 is a tension spring located in the guiding slot, and one end of the tension spring is fixed in the guiding member 82.

Figure 5:
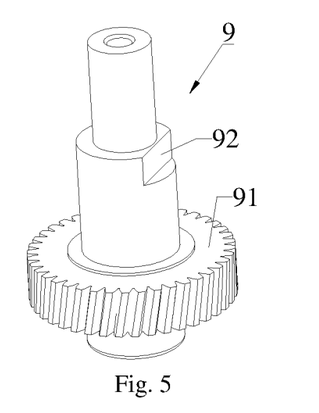
FIG. 5 is a structural schematic diagram of a rotating shaft in the display screen module according to the first embodiment of the present invention.

Referring to FIG. 4 and FIG. 5, in the embodiment, an output end of the electric driving member 3 is connected to a rotating shaft 9, and the rotating handle 7 is arranged in the rotating shaft 9 and is rotatably arranged relative to the rotating shaft 9, a cam 42 connected to the electric driving member 3 is fixed on the rotating shaft 9, and the rotating shaft 9 is rotatably arranged in the bottom case. Preferably, a bearing is sleeved in the rotating shaft 9, and the rotating shaft 9 is mounted in the bottom shell through the bearing.

Figure 6:
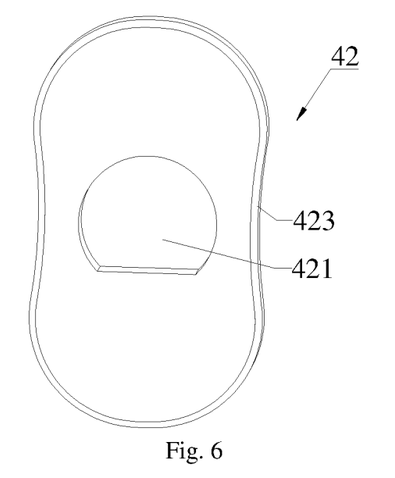
FIG. 6 is a structural schematic diagram of a cam in the display screen module according to the first embodiment of the present invention.
Figure 7:
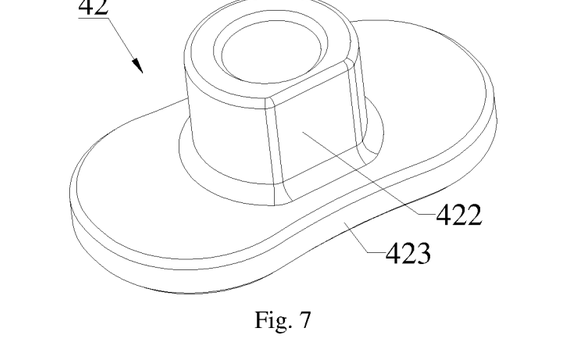
FIG. 7 is a structural schematic diagram of another cam in the display screen module according to the first embodiment of the present invention.

As shown in FIG. 5 to FIG. 7, specifically, a lower portion of the rotating shaft 9 is provided with a turbine 91, and an output end of the electric driving member 3 is a worm matched with the turbine 91. A diameter of a middle portion of the rotating shaft 9 is larger than a diameter of an upper portion of the rotating shaft 9, and the middle portion of the rotating shaft 9 is provided with a clamping segment 92. In the embodiment, the clamping segment 92 is a notch. The cam 42 connected to the electric driving member 3 is provided with a limiting hole 421 matched with the clamping segment 92, and the cam 42 is sleeved in the rotating shaft 9 through the limiting hole 421; the cam 42 connected to the rotating handle 7 is rotatably sleeved in an upper area of the rotating shaft 9, and is further optimized in that the cam 42 connected to the rotating shaft 7 is provided with a buckling position 422, the rotating handle 7 is provided with a buckling member matched with the buckling position, and the rotating handle 7 is detachably connected to the cam 42, which has the advantage that the rotating handle 7 can be removed to reduce a volume of the display screen when necessary.

In addition, the two cams 42 are not in contact with each other. After the above arrangement, the two cams 42 are mutually independent. When the electric driving member 3 is blocked so that the push-out rod 6 cannot be retracted, the user can remove the cam 42 sleeved in the clamping position, and then the push-out rod 6 is controlled to telescope only by the rotating handle 7 subsequently.

It should be understood that in the embodiment, the two cams 42 are both connected to the same rotating shaft 9. In other embodiments, the two cams 42 may be connected to different rotating shafts 9 respectively.

As shown in FIG. 2, in the embodiment, the number of the push-out rod 6 is two, the cam 42 is located between the two push-out rods 6, and the two push-out rods are arranged collinearly. Preferably, a longitudinal direction of the push-out rod 6 coincides with a longitudinal direction of the mounting frame 1, so that a linear distance between the push-out rod 6 and magnets at four corners of the screen body is closer, and a thrust force can be transmitted to the mounting frame faster, so that the unloading device can push out the screen body more preferably, accurately, and smoothly.

In the embodiment, the cam 42 comprises a first semi-circular segment, a rectangular segment and a second semi-circular segment, two opposite ends of the rectangular segment are respectively connected to the first semi-circular segment and the second semi-circular segment, and end faces of the other two ends of the rectangular segment are both concave arc surfaces 423. When contours of the first and second semi-circular segments are completely the same, the rotation center axis of the cam 42 is at a center of the rectangular segment. Further, outer contours of the two cams 42 are completely identical.

Referring to FIG. 1 and FIG. 4, optionally, one end of the push-out rod 6 butting against the cam 42 is provided with a roller wheel 10, and the roller wheel 10 rolls on a peripheral wall of the cam 42.

In the embodiment, the working principle of the manual-automatic integrated unloading device is briefly described as follows: at the beginning (when the display screen and the mounting frame are connected), the push-out rod 6 abuts against the concave arc surfaces 423 of the two cams 42, the electric driving member 3 drives the rotating shaft 9 to rotate so as to drive the cam 42 sleeved in the clamping segment 92 of the rotating shaft 9 to rotate (in this process, the rotating handle 7 and the cam 42 connected to the rotating handle 7 do not rotate), and the first and second semi-circular segments of the cam 42 butt against the push-out rod 6, so that the push-out rod 6 moves far away from the transmission member 4, so that the wedge block 61 in the push-out rod 6 butts against the roller in the mounting frame to achieve the purpose of separating the display screen from the mounting frame body. Similarly, when the user operates the rotating handle 7, similarly to the above process, the rotation of the rotating handle 7 does not cause the rotation of the rotating shaft 9. The rotating shaft 9 only provides the mounting position for the cam 42 connected to the rotating handle 7.

Second Embodiment

Figure 8:
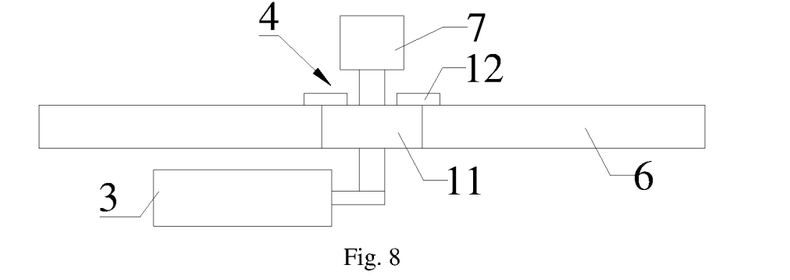
FIG. 8 is a simplified schematic diagram of a manual-automatic integrated unloading device in a display screen module according to a second embodiment of the present invention (front view)
Figure 9:
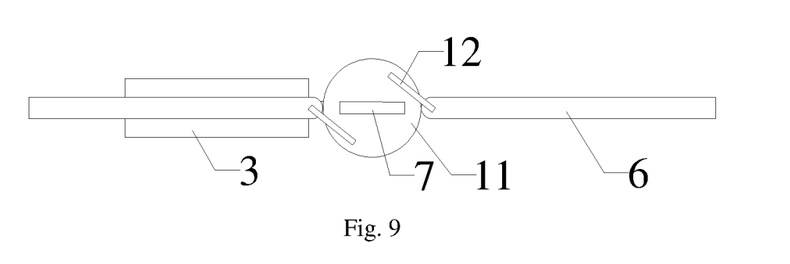
FIG. 9 is a simplified schematic diagram of the manual-automatic integrated unloading device in the display screen module according to a second embodiment of the present invention (upward view)

Referring to FIG. 8 and FIG. 9, the second embodiment of the present invention is a structure of another transmission member 4 proposed on the basis of the first embodiment, but differs from the first embodiment in that: the transmission member 4 comprises a turntable 11 and a movable member 12, the turntable 11 is rotatably arranged on a power box (not shown in the figures) of a display screen, and the movable member 12 is arranged far away from a abutment member (not shown in the figures), one end of the movable member 12 is rotatably connected to the push-out rod 6, and the other end of the movable member 12 is rotatably connected to the turntable 11. A connected portion between the movable member 12 and the turntable 11 is eccentrically arranged with a rotation center axis of the turntable 11, the electric driving member 3 and the rotating handle 7 are respectively connected to the turntable 11, and both the electric driving member 3 and the rotating handle 7 can make the turntable 11 rotate.

Third Embodiment

Figure 10:
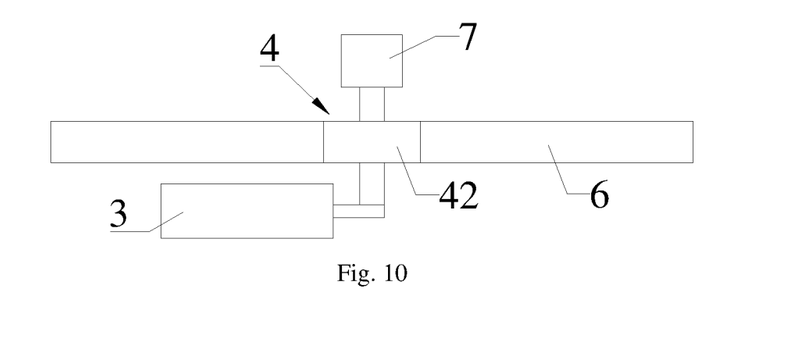
FIG. 10 is a simplified schematic diagram of a manual-automatic integrated unloading device in a display screen module according to a third embodiment of the present invention (front view)
Figure 11:
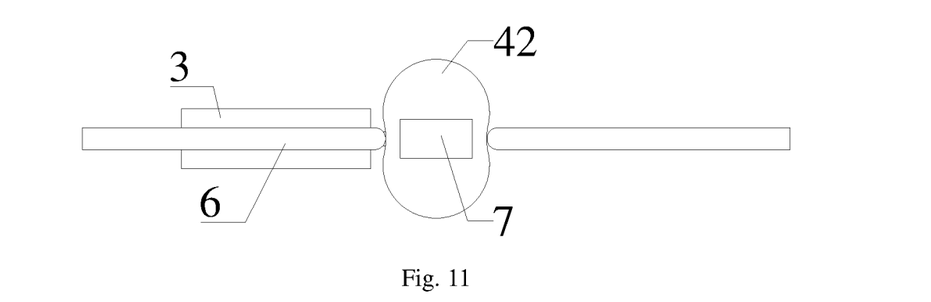
FIG. 11 is a simplified schematic diagram of the manual-automatic integrated unloading device in the display screen module according to the third embodiment of the present invention (upward view)

Referring to FIG. 10 and FIG. 11, the third embodiment of the present invention is a structure of another transmission member 4 proposed on the basis of the first embodiment, but differs from the first embodiment in that only one cam 42 is arranged in the transmission member 4. To be specific:

The transmission member comprises a cam 42 that is rotatably arranged on a power box (not shown in the figures) of a display screen, one end of the push-out rod far away from a abutment member (not shown in the figures) butts against an outer edge of the cam 42. The transmission member further comprises an elastic member (not shown in the figures), one end of the elastic member is fixed in the power box of the display screen, and the other end of the elastic member is fixed in the push-out rod 6, the elastic member is used to drive the push-out rod 6 to move towards the cam 42, the electric driving member 3 and the rotating handle 7 are respectively connected to the cam 42, and both the electric driving member 3 and the rotating handle 7 can make the cam 42 rotate.

Fourth Embodiment

Figure 12:
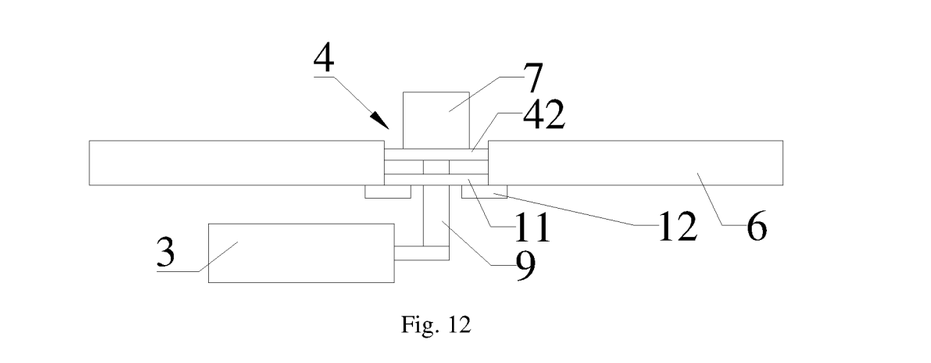
FIG. 12 is a simplified schematic diagram of a manual-automatic integrated unloading device in a display screen module according to a fourth embodiment of the present invention (front view)
Figure 13:
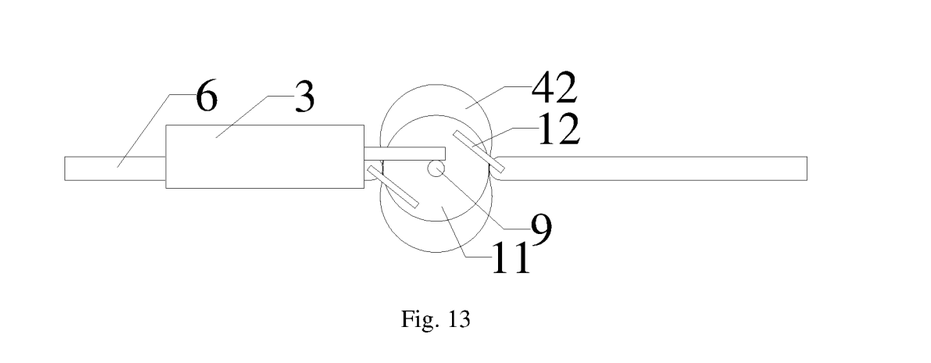
FIG. 13 is a simplified schematic diagram of the manual-automatic integrated unloading device in the display screen module according to the fourth embodiment of the present invention (upward view).

Referring to FIG. 12 and FIG. 13, the fourth embodiment of the present invention is a structure of another transmission member 4 proposed on the basis of the first embodiment, but differs from the first embodiment in that the transmission member 4 has two transmission forms comprising movable member transmission and cam transmission at the same time. To be specific, the transmission member 4 comprises a turntable 11 rotatably arranged in a power box of a display screen (not shown in the figures) and a cam 42 rotatably arranged in the power box of the display screen, and further comprises a movable member 12, the movable member 12 is arranged far away from a abutment member (not shown in the figures), one end of the movable member 12 is rotatably connected to the push-out rod 6, and the other end of the movable member 12 is rotatably connected to the turntable 11. A connected portion between the movable member 12 and the turntable 11 is eccentrically arranged with a rotation center axis of the turntable 11; and one end of the push-out rod 6 far away from the abutment member butts against an outer edge of the cam 42, and an elastic member (not shown in the figures) is further comprised. One end of the elastic member 41 is fixed in the power box of the display screen, the other end of the elastic member is fixed in the push-out rod 6, and the elastic member is used to urge the push-out rod 6 to move towards the cam 42. In the embodiment, the turntable 11 is connected to the electric driving member 3, and the cam 42 is fixedly connected to the rotating handle 7. In other embodiments, the cam 42 is connected to the electric driving member 3, and the turnplate 11 is fixedly connected to the rotating handle 7. Preferably, the rotation of the turntable 11 and the rotation of the cam 42 do not interfere with each other.

An output end of the electric driving member 3 is connected to a rotating shaft 9, the rotating handle 7 is arranged in the rotating shaft 9 and is rotatably arranged relative to the rotating shaft 9, and the turnplate 11 connected to the electric driving member 3 is fixed in the rotating shaft 9. Similarly, in other embodiments, the cam 42 connected to the electric driving member is fixed in the rotating shaft 9.

In summary, according to the manual-automatic integrated unloading device and the display screen module structure provided by the present invention, for a display screen module with a short mounting position, the user can separate the mounting frame body from the display screen by operating the rotation handle, thus reducing the power consumption, and being more environmentally friendly; when the turntable (or cam) fails to move the push-out rod away from the transmission member due to a failure, a user can make the manual-automatic integrated unloading device to work by controlling the electric driving member or the rotating handle connected to the cam (or turntable), which is beneficial for enhancing the user experience; the concave arc surfaces can allow one end of the push-out rod near the transmission member to slide smoothly on an outer peripheral wall of the cam, so as to avoid dead blockage between the push-out rod and the cam; and the electric driving member, the transmission member, the push-out rod, and the rotating handle are all arranged in the power box instead of directly in the bottom shell, so as to prevent the screen body from being deformed due to a reaction force of the push-out rod to make a display effect of the display screen become worse.

The foregoing descriptions are merely embodiments of the present invention, but are not intended to limit the patent scope of the present invention. All equivalent transformations made using the description of the present invention and the accompanying drawings, or being used directly or indirectly in other related technical fields, are similarly included in the protection scope of the present invention.

What is claimed is:

1. A manual-automatic integrated unloading device, comprising an electric driving member, a transmission member, an abutment member and a push-out rod, wherein the push-out rod is movably arranged along a length direction thereof, the electric driving member and the push-out rod are respectively connected to the transmission member, and the electric driving member drives the push-out rod to butt against the abutment member through the transmission member to increase spacing between the abutment member and the electric driving member, wherein the manual-automatic integrated unloading device further comprises a rotating handle connected to the transmission member, and the rotating handle drives the push-out rod to butt against the abutment member through the transmission member to increase the spacing between the abutment member and the electric driving member.

2. The manual-automatic integrated unloading device according to claim 1, wherein the transmission member comprises a turntable and a movable member, the movable member is arranged far away from the abutment member, one end of the movable member is rotatably connected to the push-out rod, and the other end of the movable member is rotatably connected to the turntable; a connected portion between the movable member and the turntable is eccentrically arranged with a rotation center axis of the turntable; and the electric driving member and the rotating handle are respectively connected to the turntable.

3. The manual-automatic integrated unloading device according to claim 1, wherein the transmission member comprises a rotatably arranged cam, one end of the push-out rod far away from the abutment member abuts against an outer edge of the cam, and the electric driving member and the rotating handle are respectively connected to the cam.

4. The manual-automatic integrated unloading device according to claim 3, further comprising an elastic member which is connected to the push-out rod and used to drive the push-out rod to move towards the cam.

5. The manual-automatic integrated unloading device according to claim 3, wherein the cam comprises a first semi-circular segment, a rectangular segment and a second semi-circular segment, two opposite ends of the rectangular segment are respectively connected to the first semi-circular segment and the second semi-circular segment, and end faces of the other two ends of the rectangular segment are both concave arc surfaces.

6. The manual-automatic integrated unloading device according to claim 1, wherein the transmission member comprises a rotatably arranged turnplate and a rotatably arranged cam, and one end of the push-out rod far away from abutment member abuts against an outer edge of the cam;

the manual-automatic integrated unloading device further comprises a movable member, the movable member is arranged far away from the abutment member, one end of the movable member is rotatably connected to the push-out rod, and the other end of the movable member is rotatably connected to the turntable; a connected portion between the movable member and the turntable is eccentrically arranged with a rotation center axis of the turntable; and the turntable is connected to the electric driving member, the cam is fixedly connected to the rotating handle, or the cam is connected to the electric driving member, and the turntable is fixedly connected to the rotating handle.

7. The manual-automatic integrated unloading device according to claim 6, further comprising an elastic member which is connected to the push-out rod and used to drive the push-out rod to move towards the cam.

8. The manual-automatic integrated unloading device according to claim 6, wherein an output end of the electric driving member is connected to a rotating shaft, the rotating handle is arranged in the rotating shaft and is rotatably arranged relative to the rotating shaft, the turntable connected to the electric driving member is fixed in the rotating shaft, or the cam connected to the electric driving member is fixed in the rotating shaft.

9. The manual-automatic integrated unloading device according to claim 6, wherein the cam comprises a first semi-circular segment, a rectangular segment and a second semi-circular segment, two opposite ends of the rectangular segment are respectively connected to the first semi-circular segment and the second semi-circular segment, and end faces of the other two ends of the rectangular segment are both concave arc surfaces.

10. The manual-automatic integrated unloading device according to claim 1, wherein the transmission member comprises two rotatably arranged cams, and rotation center axes of the two cams are coincidentally arranged; outer edges of the two cams respectively butt against one end of the push-out rod far away from the abutment member; and one of the cams is connected to the electric driving member and the other cam is fixedly connected to the rotating handle.

11. The manual-automatic integrated unloading device according to claim 10, wherein the transmission member further comprises an elastic member which is connected to the push-out rod and used to drive the push-out rod to move towards the cam.

12. The manual-automatic integrated unloading device according to claim 11, wherein an output end of the electric driving member is connected to a rotating shaft, the rotating handle is arranged in the rotating shaft and is rotatably arranged relative to the rotating shaft, and the cam connected to the electric driving member is fixed in the rotating shaft.

13. The manual-automatic integrated unloading device according to claim 10, wherein the cam comprises a first semi-circular segment, a rectangular segment and a second semi-circular segment, two opposite ends of the rectangular segment are respectively connected to the first semi-circular segment and the second semi-circular segment, and end faces of the other two ends of the rectangular segment are both concave arc surfaces.

\* \* \* \* \*